United States Patent
Ma et al.

(10) Patent No.: US 11,437,602 B2
(45) Date of Patent: Sep. 6, 2022

(54) DISPLAY PANEL AND MANUFACTURING METHOD THEREOF, DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Kai Ma, Hubei (CN); Gaozhen Wang, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 306 days.

(21) Appl. No.: 16/616,042

(22) PCT Filed: Oct. 16, 2019

(86) PCT No.: PCT/CN2019/111473
§ 371 (c)(1),
(2) Date: Nov. 22, 2019

(87) PCT Pub. No.: WO2020/248454
PCT Pub. Date: Dec. 17, 2020

(65) Prior Publication Data
US 2021/0367205 A1 Nov. 25, 2021

(30) Foreign Application Priority Data

Jun. 11, 2019 (CN) .......................... 201910500113.0

(51) Int. Cl.
*H01L 51/52* (2006.01)
*H01L 51/56* (2006.01)
*H01L 23/528* (2006.01)

(52) U.S. Cl.
CPC ...... *H01L 51/5253* (2013.01); *H01L 51/5259* (2013.01); *H01L 51/56* (2013.01); *H01L 23/528* (2013.01)

(58) Field of Classification Search
CPC . H01L 27/3223; H01L 51/5253; H01L 51/56; H01L 51/5259; H01L 27/3244; H01L 51/5256; H01L 33/62
(Continued)

(56) References Cited

U.S. PATENT DOCUMENTS

2018/0248153 A1* 8/2018 Cui ................. H01L 51/5256
257/40
2019/0103586 A1 4/2019 Li et al.
(Continued)

FOREIGN PATENT DOCUMENTS

CN 107204404 A 9/2017
CN 107492601 A 12/2017
(Continued)

*Primary Examiner* — Thinh T Nguyen

(57) ABSTRACT

The present invention provides a display panel comprising a base substrate, wherein the base substrate comprises a display area and a non-display area disposed around the display area; a light emitting layer disposed on the display area; a first inorganic layer disposed on the base substrate and covering the light emitting layer; a guiding structure disposed on the first inorganic layer; an organic layer disposed on the guiding structure, wherein the guiding structure is used to guide vapor in the organic layer into the non-display area; and a second inorganic layer disposed on the guiding structure and covering the organic layer.

17 Claims, 4 Drawing Sheets

(58) Field of Classification Search
USPC .......................... 257/40, 72; 438/82, 99, 48
See application file for complete search history.

(56) References Cited

U.S. PATENT DOCUMENTS

2020/0144546 A1   5/2020  Zheng et al.
2021/0210719 A1*  6/2021  Sun et al. ......... H01L 151/5253
                                                          257/40

FOREIGN PATENT DOCUMENTS

CN      109309173 A     2/2019
TW      201818581 A     5/2018

* cited by examiner

DISPLAY PANEL AND MANUFACTURING METHOD THEREOF, DISPLAY DEVICE

CROSS-REFERENCE TO RELATED APPLICATIONS

This application is a 371 U.S. National Stage of International Application No. PCT/CN2019/111473, filed on Oct. 16, 2019, which claims priority to Chinese Application No. 201910500113.0, filed on Jun. 11, 2019. The entire disclosures of the above applications are incorporated herein by reference.

FIELD OF INVENTION

The present application relates to the field of display technologies, and in particular, to a display panel, a manufacturing method thereof, and a display device.

BACKGROUND OF INVENTION

Organic electroluminescent devices, due to their self-luminescence, have advantages, such as not requiring backlights, have wide viewing angles, high color saturations, low driving voltages, low power consumptions, fast response times, light weight, thin thickness, simple structure, low cost, and are considered one of the most promising products.

At present, display technologies of the organic electroluminescent devices have become technologies that many consumers pay attention to. However, failures of the organic electroluminescent devices have been plaguing many researchers. Organic luminescent materials in the organic electroluminescent devices are particularly sensitive to oxygen and vapor, and are susceptible to oxygen and vapor attack resulting in eventual failure.

Therefore, how to improve the lifetime and stability of organic electroluminescent devices remains a key issue in the display technologies of organic electroluminescent devices.

SUMMARY OF INVENTION

An object of the present invention is to provide a display panel, a manufacturing method thereof, and a display device, so as to avoid failures of light emitting layers in the display panel by water and oxygen, thereby improving the stability of the display panel and prolonging the service life.

In order to solve the above problem, an embodiment of the present invention provides a display panel. The display panel comprises: a base substrate, wherein the base substrate comprises a display area and a non-display area disposed around the display area; a light emitting layer disposed on the display area; a first inorganic layer disposed on the base substrate and covering the light emitting layer; a guiding structure disposed on the first inorganic layer; an organic layer disposed on the guiding structure, wherein the guiding structure is used to guide vapor in the organic layer into the non-display area; and a second inorganic layer disposed on the guiding structure and covering the organic layer.

Wherein the guiding structure comprises a plurality of guiding lines and a water absorbing block contacting an end of the guiding line, and the water absorbing block is disposed in the non-display area.

Wherein the guiding structure further comprises a first ring retaining wall and a second ring retaining wall spaced apart from each other on the non-display area, the first ring retaining wall is disposed around the display area, the second ring retaining wall is disposed around the first ring retaining wall, the water absorbing block is disposed between the first ring retaining wall and the second ring retaining wall, and the guiding line partially overlaps the first ring retaining wall.

Wherein a height of the second ring retaining wall is greater than a height of the first ring retaining wall.

Wherein the guiding lines comprise a first guiding line extending in a predetermined direction, and a second guiding line disposed crossing the first guiding line Wherein the guiding lines are formed in a mesh shape, and a boundary of the organic layer does not exceed a boundary of the meshed guiding lines.

Wherein the light emitting layer comprises a plurality of pixel areas spaced apart from each other, and a projection area of the guiding line on the light emitting layer does not overlap with the pixel areas.

Wherein material of the guiding line is a metal material or an organic material having a hydrophilic group.

Wherein material of the water absorbing block is an organic material doped with desiccant particles.

In order to solve the above problem, an embodiment of the present invention further provides a manufacturing method of a display panel. The manufacturing method of the display panel comprises: providing a base substrate, wherein the base substrate comprises a display area and a non-display area disposed around the display area; forming a light emitting layer on the display area; forming a first inorganic layer on the base substrate on which the light emitting layer is formed; forming a guiding structure on the first inorganic layer; forming an organic layer on the guiding structure, wherein the guiding structure is used to guide vapor in the organic layer into the non-display area; and forming a second inorganic layer on the guiding structure formed with the organic layer.

Wherein the guiding structure comprises a plurality of guiding lines and a water absorbing block contacting an end of the guiding line, the step of forming the guiding structure on the first inorganic layer comprises: forming the water absorbing block on the first inorganic layer by inkjet printing in the non-display area; and forming the guiding lines on the first inorganic layer, and the end of the guiding line contacting the water absorbing block.

Wherein the guiding structure further comprises a first ring retaining wall and a second ring retaining wall spaced apart from each other on the non-display area, and the guiding line partially overlap the first ring retaining wall; before the step of forming the water absorbing block on the first inorganic layer by inkjet printing, further comprises: forming the first ring retaining wall and the second ring retaining wall on the non-display area of the first inorganic layer, the first ring retaining wall is disposed around the display area, and the second ring retaining wall is disposed around the first ring retaining wall; the step of forming the water absorbing block on the first inorganic layer by inkjet printing, comprises: forming the water absorbing block between the first ring retaining wall and the second ring retaining wall by inkjet printing.

In order to solve the above problem, an embodiment of the present invention further provides a display device comprising a display panel. The display panel comprises: a base substrate, wherein the base substrate comprises a display area and a non-display area disposed around the display area; a light emitting layer disposed on the display area; a first inorganic layer disposed on the base substrate and covering the light emitting layer; a guiding structure disposed on the first inorganic layer; an organic layer disposed on the guiding structure, wherein the guiding structure is used to guide vapor in the organic layer into the non-display area; and a second inorganic layer disposed on the guiding structure and covering the organic layer.

Wherein the guiding structure comprises a plurality of guiding lines and a water absorbing block contacting an end of the guiding line, and the water absorbing block is disposed in the non-display area.

Wherein the guiding structure further comprises a first ring retaining wall and a second ring retaining wall spaced apart from each other on the non-display area, the first ring retaining wall is disposed around the display area, the second ring retaining wall is disposed around the first ring retaining wall, the water absorbing block is disposed between the first ring retaining wall and the second ring retaining wall, and the guiding line partially overlaps the first ring retaining wall.

Wherein a height of the second ring retaining wall is greater than a height of the first ring retaining wall.

Wherein the guiding lines comprise a first guiding line extending in a predetermined direction, and a second guiding line disposed crossing the first guiding line.

Wherein the guiding lines are formed in a mesh shape, and a boundary of the organic layer does not exceed a boundary of the meshed guiding lines.

Wherein the light emitting layer comprises a plurality of pixel areas spaced apart from each other, and a projection area of the guiding line on the light emitting layer does not overlap with the pixel areas.

Wherein material of the guiding line is a metal material or an organic material having a hydrophilic group.

The beneficial effects of the invention are: Different from current technologies, the display panel of the present invention provides a base substrate, a light emitting layer disposed on a display area of the base substrate, a first inorganic layer disposed on the base substrate and covering the light emitting layer, a guiding structure disposed on the first inorganic layer, an organic layer disposed on the guiding structure, and a second inorganic layer disposed on the guiding structure and covering the organic layer. In this way, by adding the guiding structure to a thin film encapsulation structure of the display panel, vapor permeating into the organic layer can be guided into an non-display area through the guiding structure, thereby preventing the light emitting layer in the display panel from being eroded by water and oxygen, and improving the stability of the display panel and prolonging a service life.

DESCRIPTION OF DRAWINGS

In order to more clearly illustrate the embodiments or the technical solutions in the prior art, a brief introduction of the drawings used in the embodiments or the prior art description will be briefly described below. Obviously, the drawings in the following description are only some of the embodiments of the invention, and those skilled in the art can obtain other drawings according to the drawings without any creative work.

DETAILED DESCRIPTION OF PREFERRED EMBODIMENTS

The present invention will be further described in detail below with reference to the accompanying drawings and embodiments. In particular, the following examples are only intended to illustrate the invention, but do not limit the scope of the invention. In the same manner, the following embodiments are only partial embodiments rather than all embodiments of the present invention, and all other embodiments obtained by those skilled in the art without creative efforts are within the scope of the present invention.

In order to improve the lifetime and stability of an organic electroluminescent device, the technical solution adopted in the present invention is to provide a guiding structure into a thin film encapsulation structure of a display panel, so that vapor permeating into an organic layer can be guided into an non-display area through the guiding structure, thereby preventing a light emitting layer in the display panel from being eroded by water and oxygen, and improving the stability of the display panel and prolonging a service life.

Figure 1:
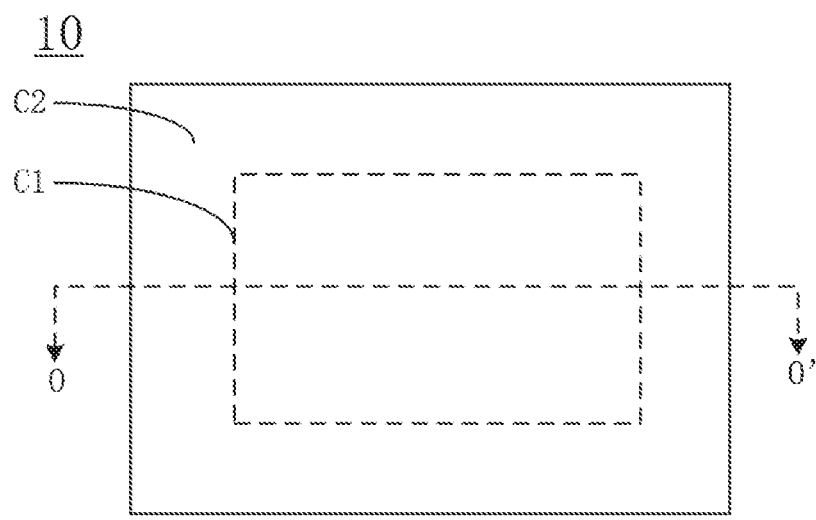
FIG. 1 is a schematic top structural view of a display panel according to an embodiment of the present invention.
Figure 2:
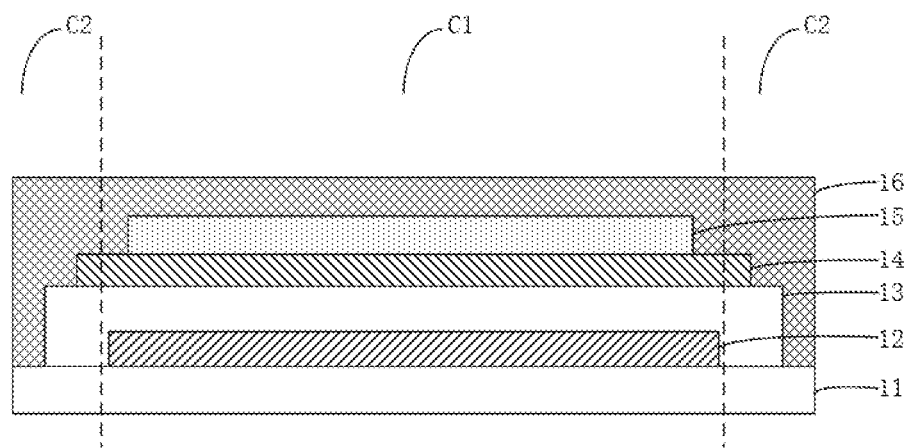
FIG. 2 is a schematic cross-sectional view taken along a line O-O' of FIG. 1.

Please refer to FIG. 1 and FIG. 2. FIG. 1 is a schematic top structural view of the display panel according to an embodiment of the present invention, and FIG. 2 is a schematic cross-sectional view taken along a line O-O' of FIG. 1. As shown in FIG. 1 and FIG. 2, the display panel 10 comprises a base substrate 11, and a light emitting layer 12, a first inorganic layer 13, a guiding structure 14, an organic layer 15, and a second inorganic layer 16, which are sequentially disposed on the base substrate 11. The base substrate 11 comprises a display area C1 and a non-display area C2 disposed around the display area C1. The light emitting layer 12 is disposed on the display area C1. The first inorganic layer 13 is disposed on the base substrate 11 and covers the light emitting layer 12. The second inorganic layer 16 is disposed on the guiding structure 14 and covers the organic layer 15. In the embodiment, vapor in the organic layer can be guided into the non-display area C2 through the guiding structure, thereby avoiding failures of the light emitting layer in the display panel from being eroded by water and oxygen.

Wherein, the base substrate 11 may be a thin film transistor (TFT) substrate with a substrate, and material of the base substrate may be glass or a hard resin, or may also be one of organic polymers, such as polyimide, polycarbonate, polyethylene terephthalate or polyethersulfone substrate. The light emitting layer 12 may comprise an anode (not shown) which is disposed sequentially away from the base substrate 11, a hole injecting layer (not shown), a hole transporting layer (not shown), and an electron blocking layer (not shown), a light emitting unit (not shown), an electron transport layer (not shown), an electron injection layer (not shown), and a cathode (not shown). Material of the first inorganic layer 13 and the second inorganic layer 16 may be one or more of silicon nitride, aluminum nitride, zirconium nitride, titanium nitride, tantalum nitride, titanium oxide, aluminum oxynitride, silicon oxynitride. Material of the organic layer 15 may be one of hexamethyldisiloxane, epoxy resin, acrolein-based resin, polyimide resin, polyethylene naphthalate, or polyethylene terephthalate.

Figure 3:
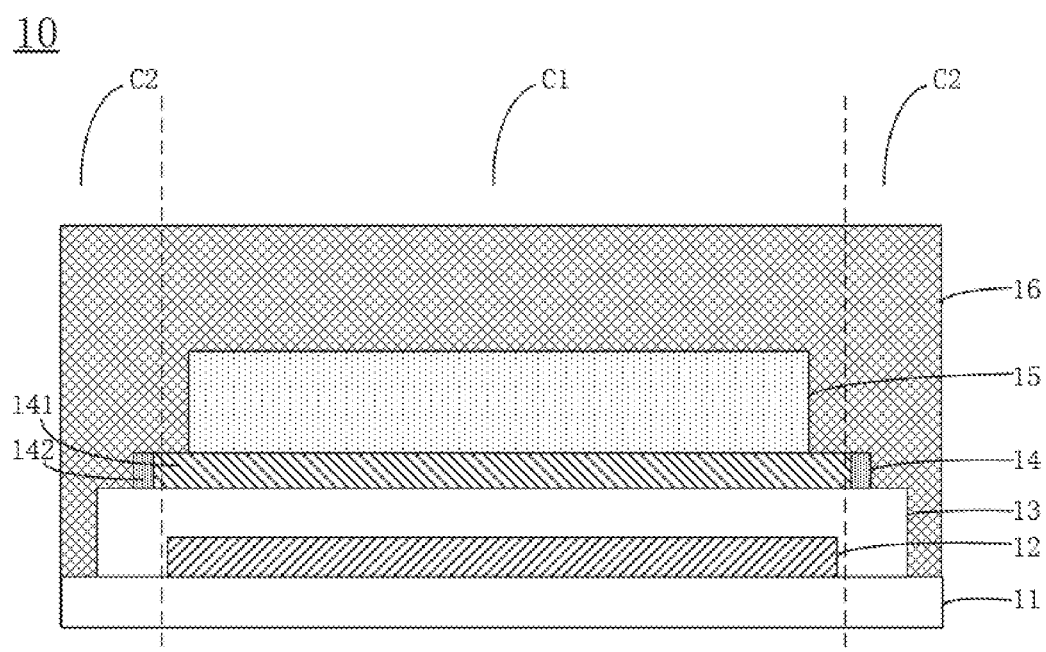
FIG. 3 is another schematic structural view of the display panel according to an embodiment of the present invention.

In an embodiment, as shown in FIG. 3, the guiding structure 14 may comprise a guiding line 141 and a water absorbing block 142 that is in contact with both ends of the guiding line 141. Wherein, the water absorption block 142 is disposed in the non-display area C2. The guiding line 141 is disposed below the organic layer 15 and has affinity for water.

Specifically, after the external environment vapor permeates into the organic layer 15 through the second inorganic layer 16, due to the hydrophilicity of the guiding line 141, water molecules entering the organic layer 15 are trapped by the guiding line 141, and then the water molecules are freed on the guiding line 141 to the water absorbing block 142 and absorbed by the water absorbing block 142 to protect the light emitting layer in the display panel from water and oxygen.

Material of the guiding line 141 may be a metal material, for example, chromium, aluminum, zinc, and hydroxides thereof, and may also be an organic material having a hydrophilic group (for example, a hydroxyl group, an ether bond, an amino group, a carboxylic acid group, etc.). The material of the water absorbing block 142 may be an organic material doped with desiccant particles, and the water absorbing block 142 may be formed by inkjet printing. Wherein, the material of the desiccant particles may be an alkali metal oxide such as calcium oxide or cerium oxide.

In this embodiment, the shape and number of the guiding line 141 may not be limited. For example, the number of the guiding line 141 may be one or more, and the shape of the guiding line 141 may be a straight line or a curve. For another example, the shape of the guiding line 141 may also be a rectangular plane, the organic layer 15 is disposed on the rectangular plane, and the water absorption block 142 is disposed around the rectangular plane.

Figure 4:
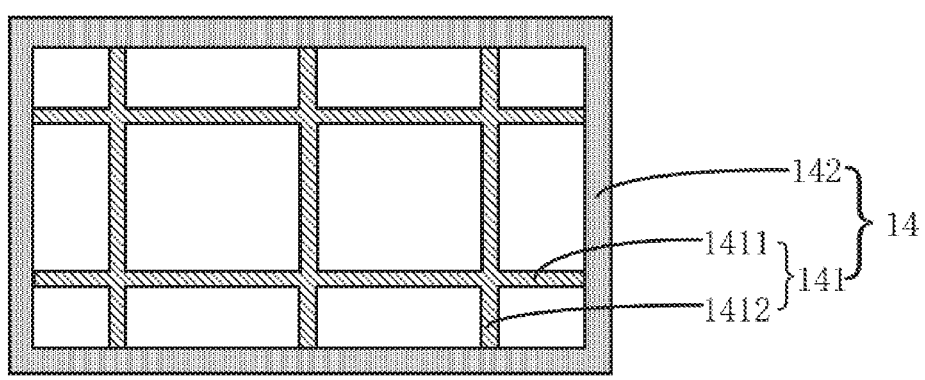
FIG. 4 is a schematic structural view of a guiding structure of FIG. 3.

In an embodiment, as shown in FIG. 4, the number of the guiding lines 141 is plural, and the water absorbing block 142 may be disposed around the plurality of guiding lines 141 and in contact with both ends of each of the guiding lines 141, which can more efficiently guide vapor in the organic layer 15 into the water absorbing block 142 disposed in the non-display area C2.

Specifically, referring to FIG. 4, the guiding lines 141 may comprise a first guiding line 1411 extending in a predetermined direction and a second guiding line 1412 disposed crossing the first guiding line 1411. For example, the first guiding line 1411 may be disposed to extend in a horizontal direction, and the second guiding line 1412 may be disposed to extend in a vertical direction.

The shape of the guiding lines 141 may be a mesh shape, and the boundary of the organic layer 15 does not exceed the boundary of the mesh guiding line 141 to more effectively guide the vapor in the organic layer 15. Moreover, the mesh shaped guiding line 141 can also increase the bonding force between the organic layer 15 and the guiding line 14, and reduce a thickness of a thin film packaging structure.

In some embodiments, the light emitting layer 12 may comprise a plurality of pixel areas spaced apart from each other, and a projection area of the guiding line 141 on the light emitting layer 12 does not overlap with the pixel areas to avoid the influence of the guiding line 141 on the transmittance of the display panel.

Specifically, the pixel area is correspondingly disposed with pixel units, and each of the pixel units may comprise a blue sub-pixel, a green photo sub-pixel, and a red sub-pixel.

The guiding line 141 may be disposed above the area between the adjacent pixel areas. In addition, when the material of the guiding line 141 is a metal material, the metal material is preferably a transparent metal material to further avoid reflection and absorption of light emitted by the guiding line to the pixel area.

Figure 5:
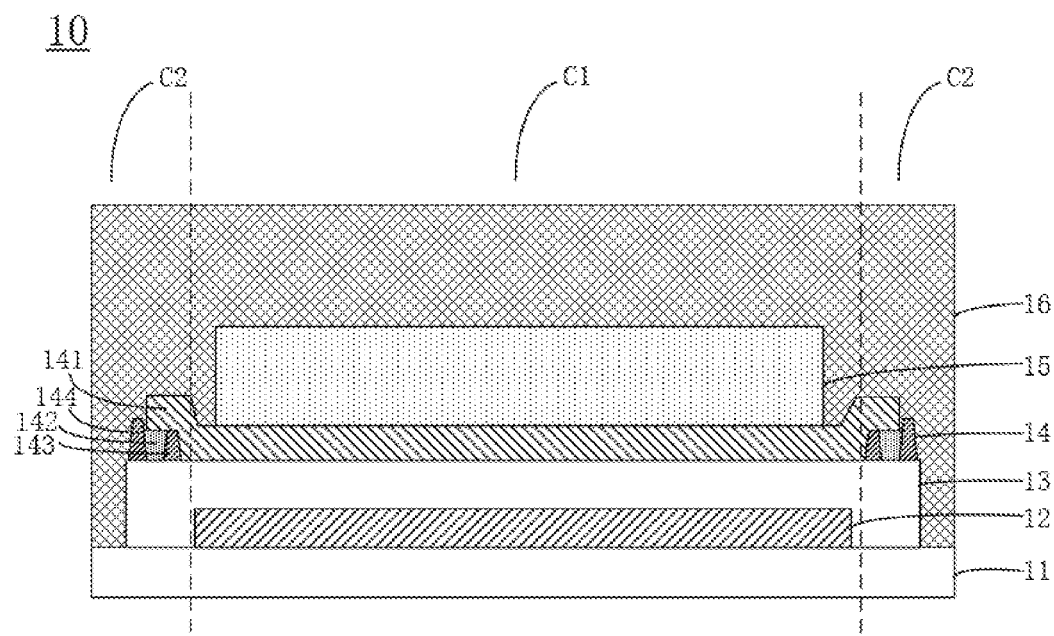
FIG. 5 is another schematic structural view of the display panel according to an embodiment of the present invention.
Figure 6:
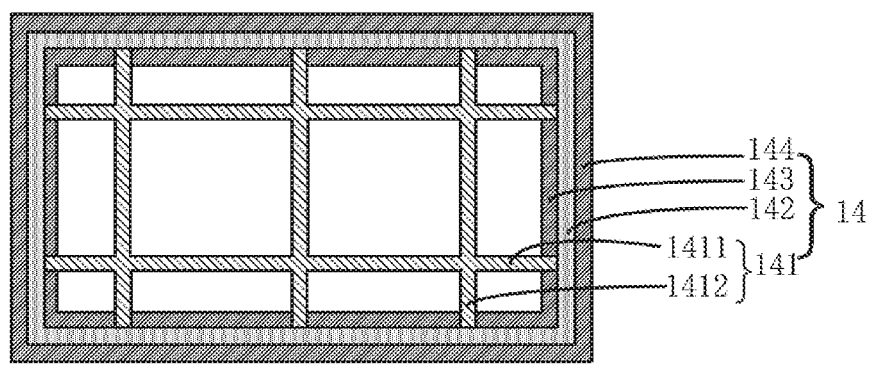
FIG. 6 is a schematic structural view of a guiding structure of FIG. 5.

In another embodiment, as shown in FIG. 5, the guiding structure 14 further comprises a first ring retaining wall 143 and a second ring retaining wall 144 spaced apart from each other on the non-display area C2, the first ring retaining wall 143 is disposed around the display area C1, the second ring retaining wall 144 is disposed around the first ring retaining wall 143, the water absorbing block 142 is disposed between the first ring retaining wall 143 and the second ring retaining wall 144, and the guiding line 141 partially overlaps the first ring retaining wall 143 to connect with the water absorbing block 142 across the first ring retaining wall 143.

Materials of the first ring retaining wall 143 and the second ring retaining wall 144 may be organic insulating materials.

Specifically, the first ring retaining wall 143 and the second ring retaining wall 144 may be used to define a formation area of the water absorbing block 142. For example, an organic material forming the water absorbing block 142 may be dropped between the first ring retaining wall 143 and the second ring retaining wall 144 by inkjet printing to avoid the problem that the water absorbing block cannot be shaped and flowed everywhere. At the same time, the first ring retaining wall 143 and the second ring retaining wall 144 can also block water and oxygen to protect the light emitting layer in the display area from being eroded by water and oxygen.

In addition, the first ring retaining wall 143 and the second ring retaining wall 144 may also be used to define a formation area of the organic layer 15 to block the leakage of the organic layer material. Moreover, a height of the second ring retaining wall 144 may be set to be greater than a height of the first ring retaining wall 143, so that the second ring retaining wall 144 buffers and further blocks the organic layer material overflowing the first ring retaining wall 143.

It is to be noted that the first inorganic layer 13, the guiding structure 14, the organic layer 15, and the second inorganic layer 16 together constitute the thin film encapsulation structure of the display panel 10 for protecting the light emitting layer 12 from being eroded by water and oxygen. In some embodiments, in order to more effectively block external water and oxygen, the number of organic layers, inorganic layers, and guiding structures in the thin film encapsulation structure may be increased. For example, the thin film encapsulation structure of the display panel may comprise a first inorganic layer, a first organic layer, a second inorganic layer, a second organic layer, and a third inorganic layer. As such, it may be selected to provide the above guiding structure only between the second inorganic layer and the second organic layer, or alternatively between the first inorganic layer and the first organic layer, and between the second inorganic layer and the second organic layer to more effectively improve the stability of the display panel and prolong the service life.

Different from the prior art, in the display panel of the embodiment, by adding the guiding structure to the thin film encapsulation structure of the display panel, vapor permeating into the organic layer can be guided into the non-display area through the guiding structure, thereby preventing the light emitting layer in the display panel from being eroded by water and oxygen, and improving the stability of the display panel and prolonging the service life.

Figure 7:
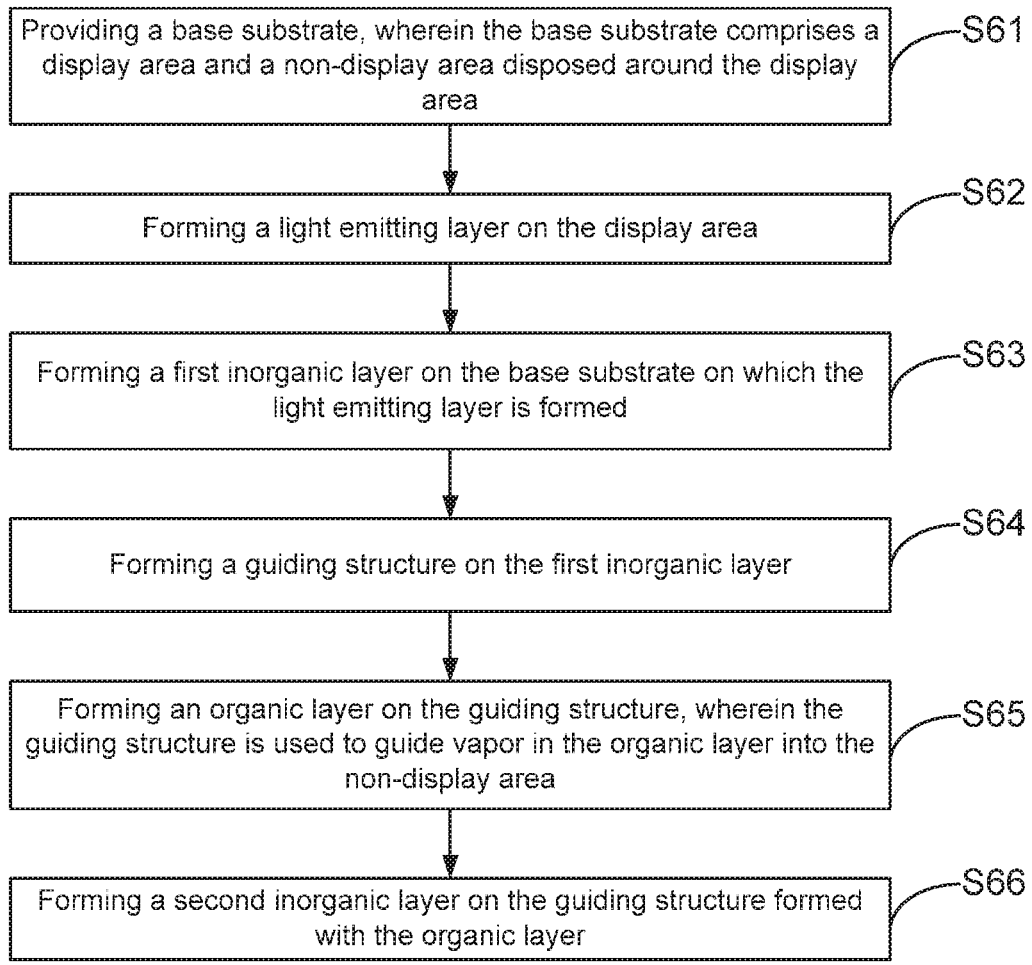
FIG. 7 is a schematic flow chart of a manufacturing method of the display panel according to an embodiment of the present invention.

Please refer to FIG. 7. FIG. 7 is a schematic flow chart of a manufacturing method of the display panel according to an embodiment of the present invention. The manufacturing method of the display panel comprises the following steps:

S61: Providing a base substrate, wherein the base substrate comprises a display area and a non-display area disposed around the display area.

The base substrate may be a TFT substrate with a substrate. Material of the substrate may be glass or a hard resin, and may also be one of organic polymers such as polyimide, polycarbonate, polyethylene terephthalate, polyethersulfone substrate, and the like.

S62: Forming a light emitting layer on the display area.

For example, an anode, a hole injecting layer, a hole transporting layer, an electron blocking layer, a light emitting unit, an electron transport layer, an electron injection layer, and a cathode may be sequentially formed on the display area of the base substrate. Wherein, the anode, the hole injection layer, the hole transport layer, the electron blocking layer, the light emitting unit, the electron transport layer, the electron injection layer, and the cathode which are stacked in combination to form the light emitting layer of the display panel.

S63: Forming a first inorganic layer on the base substrate on which the light emitting layer is formed.

For example, the first inorganic layer is deposited on a base substrate on which the light emitting layer is formed by a chemical vapor deposition process. Material of the first inorganic layer may be one or more of silicon nitride, aluminum nitride, zirconium nitride, titanium nitride, tantalum nitride, titanium oxide, aluminum oxynitride, and silicon oxynitride.

S64: Forming a guiding structure on the first inorganic layer.

In an embodiment, the guiding structure may comprise a guiding line and a water absorbing block that is in contact with both ends of the guiding line. Wherein, the water absorption block is disposed in the non-display area. The guiding line is disposed below the organic layer and has affinity for water. Specifically, the shape and number of the guiding lines may not be limited. For example, the number of the guiding line may be one or more, and the shape of the guiding line may be a straight line or a curve. For another example, the shape of the guiding line may also be a rectangular plane, and the organic layer is disposed on the rectangular plane, and the water absorption block is disposed around the rectangular plane.

Wherein, when the guiding structure comprises a plurality of guiding lines, the water absorbing block may be disposed around the guiding lines, and is in contact with two ends of each of the guiding lines. S14 may specifically comprise:

Sub-step A: Forming the water absorbing block on the first inorganic layer by inkjet printing in the non-display area.

Material of the water absorbing block may be an organic substance doped with a desiccant particle, and the material of the desiccant particle may be an alkali metal oxide such as calcium oxide or cerium oxide.

Sub-step B: Forming the guiding lines on the first inorganic layer, and the end of the guiding line contacting the water absorbing block.

For example, on the area defined by the above-mentioned water absorbing block, a plurality of guiding lines is formed by sputtering or inkjet printing. Wherein, material of the guiding line may be a metal material, for example, chromium, aluminum, zinc and hydroxides thereof, and may also be an organic material having a hydrophilic group (for example, a hydroxyl group, an ether bond, an amino group, a carboxylic acid group, etc.).

In a specific embodiment, the guiding structure may further comprise a first ring retaining wall and a second ring retaining wall spaced apart from each other on the non-display area. The first ring retaining wall is disposed around the display area, the second ring retaining wall is disposed around the first ring retaining wall, the water absorbing block is disposed between the first ring retaining wall and the second ring retaining wall, and the guiding line partially overlaps the first ring retaining wall to connect with the water absorbing block across the first ring retaining wall.

Specifically, before sub-step A, the method may further comprise:

Sub-step C: Forming a first ring retaining wall and a second ring retaining wall on the non-display area of the first inorganic layer.

Wherein, the materials of the first ring retaining wall and the second ring retaining wall may be organic insulating materials.

Sub-step A may specifically comprise:

Using inkjet printing to form a water absorbing block between the first ring retaining wall and the second ring retaining wall.

In this way, it is possible to avoid the problem that the water absorbing block cannot be shaped and flowed everywhere to cause leakage. At the same time, the first ring retaining wall and the second ring retaining wall can also block water and oxygen to protect the light emitting layer in the display area from being eroded by water and oxygen. In addition, the first ring retaining wall and the second ring retaining wall may also be used to define a formation area of the organic layer to block the leakage of the organic layer material. Moreover, a height of the second ring retaining wall may be set to be greater than a height of the first ring retaining wall, so that the second ring retaining wall buffers and further blocks the organic layer material overflowing the first ring retaining wall.

In the embodiment, the sub-step B may specifically comprise:

Forming a plurality of guiding lines on the first inorganic layer and the first ring retaining wall, and contacting the end of the guiding line with the water absorbing block.

S65: Forming an organic layer on the guiding structure, wherein the guiding structure is used to guide vapor in the organic layer into the non-display area.

For example, an inkjet printing method is used to form an organic layer on the guiding structure. Material of the organic layer may be one of hexamethyldisiloxane, epoxy resin, acrolein-based resin, polyimide resin, polyethylene naphthalate, polyethylene terephthalate.

Specifically, when the guiding structure comprise a plurality of guiding lines and a water absorbing block that is in contact with both ends of the guiding line, S65 may be: forming an organic layer on the guiding lines by inkjet printing. Thus, after the external environment vapor permeates into the organic layer through the second inorganic layer, due to the hydrophilicity of the guiding line, water molecules entering the organic layer are trapped by the guiding line, and then the water molecules are freed on the guiding line to the water absorbing block and absorbed by the water absorbing block to protect the light emitting layer in the display panel from being eroded by water and oxygen.

In some embodiments, the shape of the guiding lines may be a mesh shape, and the boundary of the organic layer does not exceed the boundary of the mesh guiding line to more effectively guide the vapor in the organic layer. Moreover, the mesh shaped guiding line can also increase the bonding force between the organic layer and the guiding line, and reduce a thickness of the thin film packaging structure.

S66: Forming a second inorganic layer on the guiding structure formed with the organic layer.

For example, the second inorganic layer is deposited on a base substrate on which the light emitting layer is formed by a chemical vapor deposition process. The material of the second inorganic layer may be one or more of silicon nitride, aluminum nitride, zirconium nitride, titanium nitride, tantalum nitride, titanium oxide, aluminum oxynitride, and silicon oxynitride.

Different from the prior art, in the manufacturing method of the display panel of the embodiment, by adding the guiding structure to a thin film encapsulation structure of the display panel, vapor permeating into the organic layer can be guided into an non-display area through the guiding structure, thereby preventing the light emitting layer in the display panel from being eroded by water and oxygen, and improving the stability of the display panel and prolonging the service life.

Figure 8:
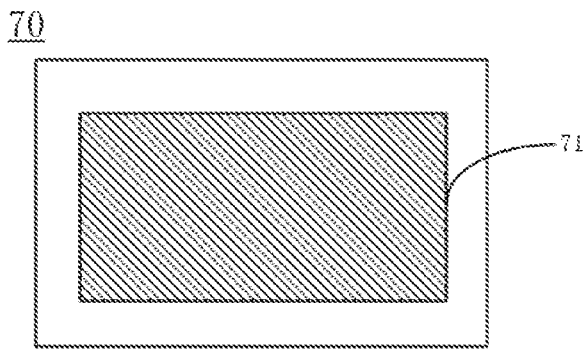
FIG. 8 is another schematic structural view of the display device according to an embodiment of the present invention.

Please refer to FIG. 8. FIG. 8 is a schematic structural view of a display device according to an embodiment of the present invention. The display device 70 comprises the display panel 71 of any of the above embodiments.

Specifically, the display panel 71 comprises a base substrate, and a light emitting layer, a first inorganic layer, a guiding structure, an organic layer, and a second inorganic layer which are sequentially disposed on the base substrate. Wherein the base substrate comprises a display area and a non-display area disposed around the display area. A light emitting layer is disposed on the display area. A first inorganic layer is disposed on the base substrate and covers the light emitting layer. A second inorganic layer is disposed on the guiding structure and covers the organic layer. In the embodiment, the guiding structure is used to guide vapor in the organic layer to the non-display area to avoid failures of the light emitting layer in the display panel to be eroded by water and oxygen.

Different from the prior art, in the display device of the embodiment, by adding the guiding structure to a thin film encapsulation structure of the display panel, vapor permeating into the organic layer can be guided into an non-display area through the guiding structure, thereby preventing the light emitting layer in the display panel from being eroded by water and oxygen, and improving the stability of the display panel and prolonging the service life.

In the above, various other corresponding changes and modifications can be made according to the technical solutions and technical ideas of the present invention to those skilled in the art, and all such changes and modifications are within the scope of the claims of the present invention.

What is claimed is:

1. A display panel, comprising:
 a base substrate, wherein the base substrate comprises a display area and a non-display area disposed around the display area;
 a light emitting layer disposed on the display area;
 a first inorganic layer disposed on the base substrate and covering the light emitting layer;
 a guiding structure disposed on the first inorganic layer;
 an organic layer disposed on the guiding structure, wherein the guiding structure is used to guide vapor in the organic layer into the non-display area; and
 a second inorganic layer disposed on the guiding structure and covering the organic layer.

2. The display panel as claimed in claim 1, wherein the guiding structure comprises a plurality of guiding lines and a water absorbing block contacting an end of the guiding line, and the water absorbing block is disposed in the non-display area.

3. The display panel as claimed in claim 2, wherein the guiding structure further comprises a first ring retaining wall and a second ring retaining wall spaced apart from each other on the non-display area, the first ring retaining wall is disposed around the display area, the second ring retaining wall is disposed around the first ring retaining wall, the water absorbing block is disposed between the first ring retaining wall and the second ring retaining wall, and the guiding line partially overlaps the first ring retaining wall.

4. The display panel as claimed in claim 3, wherein a height of the second ring retaining wall is greater than a height of the first ring retaining wall.

5. The display panel as claimed in claim 2, wherein the guiding lines comprise a first guiding line extending in a predetermined direction, and a second guiding line disposed crossing the first guiding line.

6. The display panel as claimed in claim 2, wherein the guiding lines are formed in a mesh shape, and a boundary of the organic layer does not exceed a boundary of the meshed guiding lines.

7. The display panel as claimed in claim 2, wherein the light emitting layer comprises a plurality of pixel areas spaced apart from each other, and a projection area of the guiding line on the light emitting layer does not overlap with the pixel areas.

8. The display panel as claimed in claim 2, wherein material of the guiding line is a metal material or an organic material having a hydrophilic group.

9. The display panel as claimed in claim 2, wherein material of the water absorbing block is an organic material doped with desiccant particles.

10. A display device, which comprises a display panel, and the display panel comprises:
 a base substrate, wherein the base substrate comprises a display area and a non-display area disposed around the display area;
 a light emitting layer disposed on the display area;
 a first inorganic layer disposed on the base substrate and covering the light emitting layer;
 a guiding structure disposed on the first inorganic layer;
 an organic layer disposed on the guiding structure, wherein the guiding structure is used to guide vapor in the organic layer into the non-display area; and
 a second inorganic layer disposed on the guiding structure and covering the organic layer.

11. The display device as claimed in claim 10, wherein the guiding structure comprises a plurality of guiding lines and a water absorbing block contacting an end of the guiding line, and the water absorbing block is disposed in the non-display area.

12. The display device as claimed in claim 11, wherein the guiding structure further comprises a first ring retaining wall and a second ring retaining wall spaced apart from each other on the non-display area, the first ring retaining wall is disposed around the display area, the second ring retaining wall is disposed around the first ring retaining wall, the water absorbing block is disposed between the first ring retaining wall and the second ring retaining wall, and the guiding line partially overlaps the first ring retaining wall.

13. The display device as claimed in claim 12, wherein a height of the second ring retaining wall is greater than a height of the first ring retaining wall.

14. The display device as claimed in claim 11, wherein the guiding lines comprise a first guiding line extending in a predetermined direction, and a second guiding line disposed crossing the first guiding line.

15. The display device as claimed in claim 11, wherein the guiding lines are formed in a mesh shape, and a boundary of the organic layer does not exceed a boundary of the meshed guiding lines.

16. The display device as claimed in claim 11, wherein the light emitting layer comprises a plurality of pixel areas spaced apart from each other, and a projection area of the guiding line on the light emitting layer does not overlap with the pixel areas.

17. The display device as claimed in claim 11, wherein the material of the guiding line is a metal material or an organic material having a hydrophilic group.

* * * * *